United States Patent
Ryu et al.

(10) Patent No.: US 7,922,820 B2
(45) Date of Patent: Apr. 12, 2011

(54) HEATING CRUCIBLE AND DEPOSITION APPARATUS INCLUDING THE SAME

(75) Inventors: Seoung-Yoon Ryu, Suwon-si (KR); Kyong-Tac Yu, Suwon-si (KR); Sung-Rag Ma, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 11/266,397

(22) Filed: Nov. 4, 2005

(65) Prior Publication Data

US 2006/0096542 A1 May 11, 2006

(30) Foreign Application Priority Data

Nov. 5, 2004 (KR) .................. 10-2004-0089650

(51) Int. Cl.
*H01L 21/00* (2006.01)
*C23C 16/00* (2006.01)
*C23C 14/00* (2006.01)

(52) U.S. Cl. .................. 118/726; 118/720; 219/420
(58) Field of Classification Search .................. 118/726; 392/389; 219/420
See application file for complete search history.

(56) References Cited

U.S. PATENT DOCUMENTS

| | | | | | |
|---|---|---|---|---|---|
| 5,976,263 | A | * | 11/1999 | Poole | 118/726 |
| 6,162,300 | A | * | 12/2000 | Bichrt | 118/726 |
| 6,296,894 | B1 | * | 10/2001 | Tanabe et al. | 427/8 |
| 2004/0042770 | A1 | * | 3/2004 | Choe et al. | 392/389 |
| 2004/0139914 | A1 | * | 7/2004 | Yamazaki et al. | 118/719 |
| 2005/0022743 | A1 | * | 2/2005 | Sakata et al. | 118/726 |
| 2005/0034671 | A1 | * | 2/2005 | Ohara | 118/726 |

FOREIGN PATENT DOCUMENTS

| | | | |
|---|---|---|---|
| JP | 60-214522 | * | 10/1985 |
| JP | 01-226792 | * | 9/1989 |
| JP | H03-45955 | | 4/1991 |
| JP | 10-204622 | | 8/1998 |
| JP | 2004-027252 | | 1/2004 |
| JP | 2004-214185 | | 7/2004 |
| JP | 2005293969 | * | 10/2005 |
| KR | 2001-0083447 | * | 9/2001 |
| WO | WO 03/079420 | * | 9/2003 |

* cited by examiner

*Primary Examiner* — Ram N. Kackar
(74) *Attorney, Agent, or Firm* — H.C. Park & Associates, PLC

(57) ABSTRACT

A heating crucible and a deposition apparatus are provided that have a uniform deposition rate and good reproducibility. The heating crucible of the deposition apparatus includes a titanium body with an internal cavity to contain a material to be deposited and an opening to emit the material to be deposited, a wire to heat the body, and an insulator to insulate the body from the wire.

14 Claims, 8 Drawing Sheets

HEATING CRUCIBLE AND DEPOSITION APPARATUS INCLUDING THE SAME

CROSS REFERENCE TO RELATED APPLICATION

This application claims priority to and the benefit of Korean Patent Application No. 10-2004-0089650, filed on Nov. 5, 2004, which is hereby incorporated by reference for all purposes as if fully set forth herein.

BACKGROUND OF THE INVENTION

1. Field of the Invention

The present invention relates to a heating crucible that has a uniform deposition rate and good deposition reproducibility. The present invention also relates to a deposition apparatus that uses the heating crucible in a deposition process.

2. Description of the Related Art

Electroluminescence display devices are expected to be the next generation of emissive display devices due to their wide viewing angles, high contrast and high response speed.

Electroluminescence display devices are classified as either organic light emitting display devices or inorganic light emitting display devices depending on the material that forms an emission layer (EML) included therein. Organic light emitting display devices are brighter and have a higher driving voltage and higher response speed than inorganic light emitting display devices. Organic light emitting display devices can also display color images.

An organic light emitting diode (OLED) is an organic light emitting display device. An OLED includes an inner layer located between electrodes facing each other. The inner layer can be, but is not limited to, a Hole Injection Layer (HIL), a Hole Transport Layer (HTL), an EML, an Electron Transport Layer (ETL), an Electron Injection Layer (EIL). These layers are known as organic thin films.

Organic thin films such as the HIL, HTL, EML, ETL, EIL, or the like can be formed on a substrate using a deposition method in a deposition apparatus to fabricate the OLED. In a typical deposition method, the internal pressure of a chamber is reduced to between $10^{-6}$ to $10^{-7}$ torr. The chamber contains a heating crucible that faces a substrate. Organic material is injected into the heating crucible, and the organic material is evaporated or sublimated to deposit the organic material on the substrate.

Organic materials must have a uniform deposition rate and good reproducibility to be uniformly deposited on a substrate to make organic light emitting display devices capable of reproducing a uniform image on an entire screen. Heating crucibles made of ceramic do not have a uniform deposition rate and good reproducibility.

SUMMARY OF THE INVENTION

The present invention provides a heating crucible that has a uniform deposition rate and good deposition reproducibility. The present invention also relates to a deposition apparatus that uses the heating crucible in a deposition process.

Additional features of the invention will be set forth in the description which follows, and in part will be apparent from the description, or may be learned by practice of the invention.

The present invention discloses a heating crucible of a deposition apparatus that includes a body made of titanium with an internal cavity to contain material to be deposited and an opening to emit the material to be deposited, a wire to heat the body, and an insulator to insulate the body from the wire.

The present invention also discloses a deposition apparatus including a supporter to support a substrate on which a deposition film is formed and a heating crucible facing the substrate to emit a material to be deposited. The heating crucible includes a titanium body with an internal cavity to contain a material to be deposited and an opening to emit the material to be deposited, a wire to heat the body, and an insulator to insulate the body from the wire.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
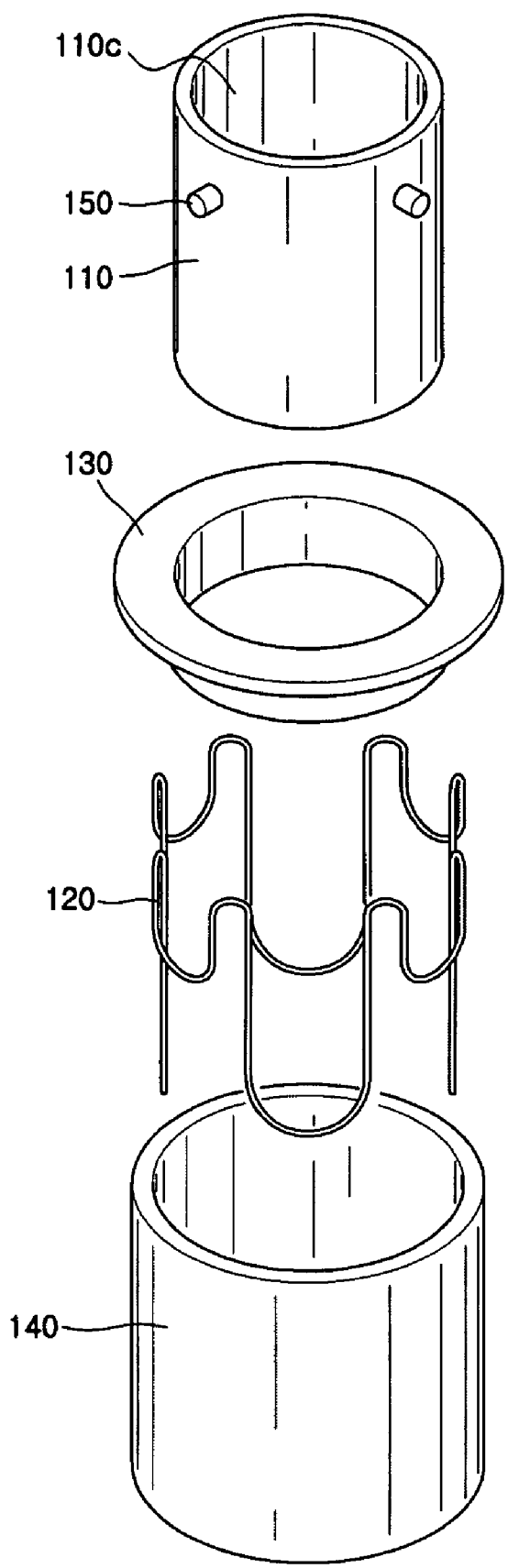
FIG. 1 shows an exploded perspective view schematically illustrating a heating crucible of a deposition apparatus according to an exemplary embodiment of the present invention.

The heating crucible of the deposition apparatus includes a titanium body with an internal cavity to contain a material to be deposited and an opening to emit the material to be deposited, a wire to heat the body, and an insulator to insulate the body from the wire. The present invention also relates to a deposition apparatus that uses the heating crucible in a deposition process.

The heating crucible and the deposition apparatus allow an organic or metal film to be deposited with a uniform deposition rate and good reproducibility. Furthermore, an organic or metal film can be deposited with a uniform deposition rate and good reproducibility to make display devices capable of reproducing a uniform image on an entire screen.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
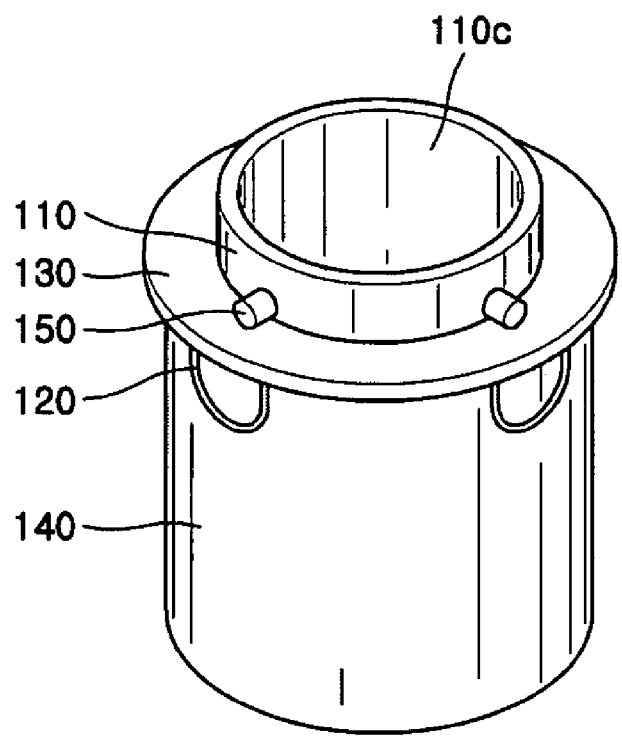
FIG. 2 shows a perspective view schematically illustrating the heating crucible of the deposition apparatus of FIG. 1.
Figure 3:
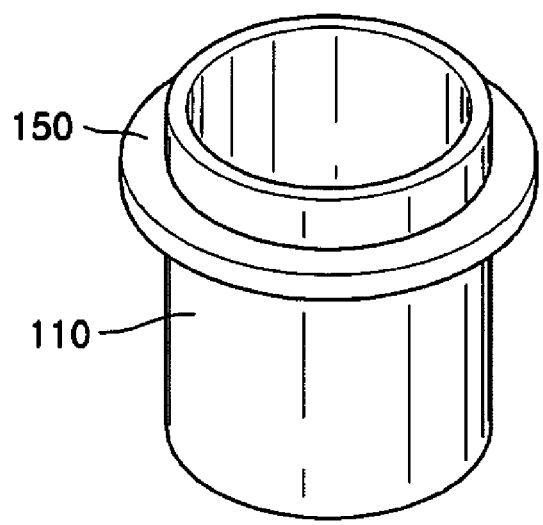
FIG. 3 shows a perspective view schematically illustrating a modification of a body included in the heating crucible of the deposition apparatus according to an exemplary embodiment of the present invention.
Figure 4:
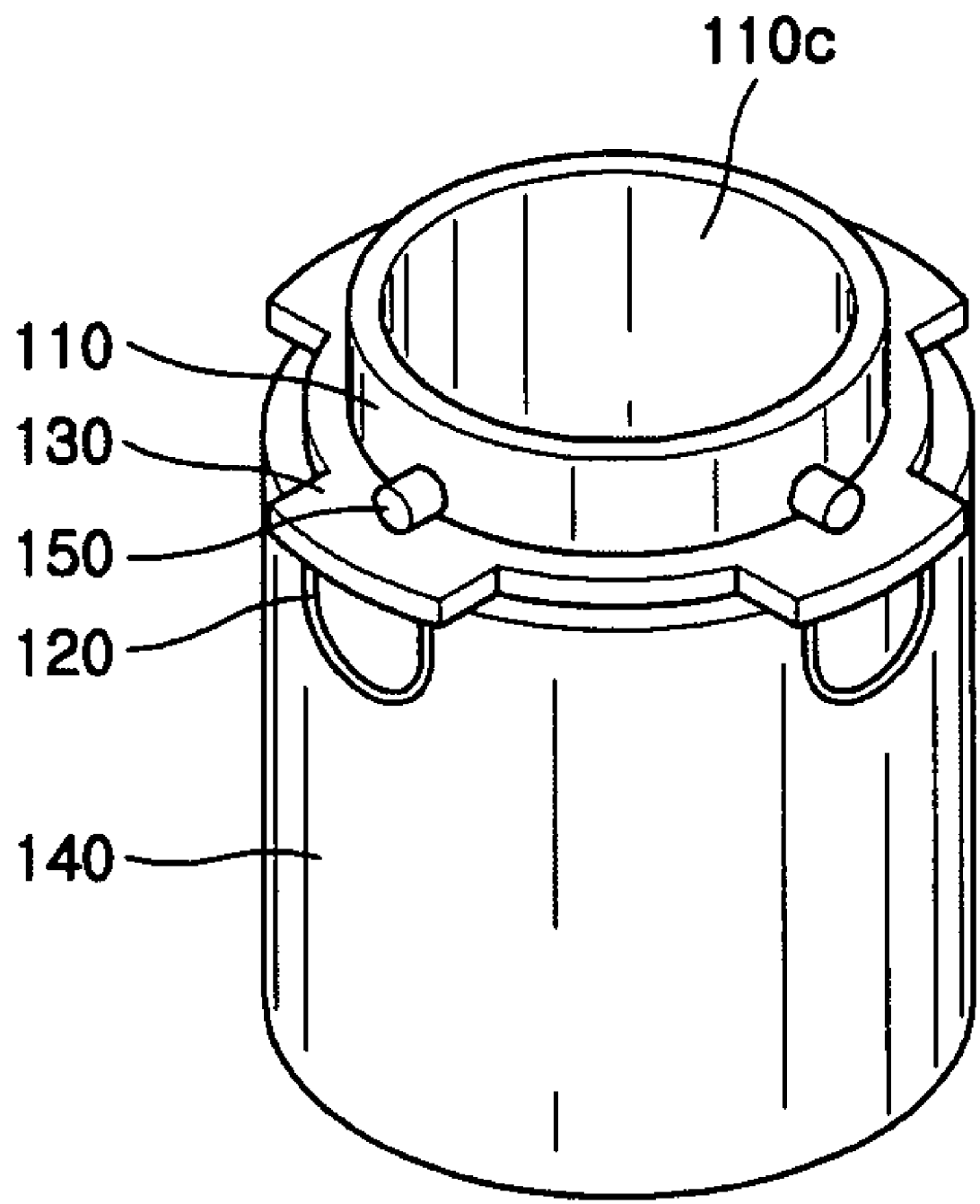
FIG. 4 shows a perspective view schematically illustrating a modification of the heating crucible of the deposition apparatus according to an exemplary embodiment of the present invention.

FIG. 1 shows an exploded perspective view schematically illustrating a heating crucible of a deposition apparatus according to an exemplary embodiment of the present invention. FIG. 2 shows a perspective view schematically illustrating the heating crucible of the deposition apparatus of FIG. 1. FIG. 3 shows a perspective view schematically illustrating a modification of a body included in the heating crucible of the deposition apparatus according to an exemplary embodiment of the present invention. FIG. 4 shows a perspective view schematically illustrating a modification of the heating crucible of the deposition apparatus according to an exemplary embodiment of the present invention.

Referring to FIG. 1 and FIG. 2, the heating crucible includes a body 110 made of titanium with an internal cavity to contain a material to be deposited and an opening 110c to emit the material to be deposited, a wire 120 to heat the body 110, and an insulator 130 to insulate the body 110 from the wire 120. The body 110 may include a temperature sensor such as a thermocouple to measure the temperature of the material in the bottom section of the body 110.

The heating crucible further includes a cylindrically shaped supporter 140. The supporter 140 may have a variety of other shapes.

The body 110 further includes a protrusion 150 for supporting the body 110 on the upper section of the supporter 140. The protrusion 150 may be any shape and may be plural as illustrated in FIG. 1 or singular as illustrated in FIG. 3. The wire 120 included in the heating crucible forms a plurality of "U" shapes that extend downward from the top of the supporter 140 along the inside and outside walls of the supporter 140. Alternatively, the wire may be arranged in any shape or configuration.

The body 110 is made of titanium instead of ceramic because a change in the heating power causes less change in the interior temperature of a titanium body than it does in a conventional ceramic body.

Table 1 below indicates the temperature change of the interior and exterior walls of a body made of ceramic when a deposition apparatus increases the heating power applied to the body from 15% to 20%.

TABLE 1

| Body made of Ceramic | | |
| --- | --- | --- |
| Heating Power | Temperature of Interior Wall (° C.) | Temperature of Exterior Wall (° C.) |
| 15% | 132 | 205 |
| 20% | 233 | 295 |

Table 1 shows that when the heating power is increased by 5%, the temperature of both the interior and exterior walls of the ceramic body increases by about 100° C.

Table 2 below indicates the temperature change of the interior and exterior walls of a body made of titanium 110 when a deposition apparatus increases the heating power applied to the body from 19% to 29%.

TABLE 2

| Body made of Titanium | | |
| --- | --- | --- |
| Heating Power | Temperature of Interior Wall (° C.) | Temperature of Exterior Wall (° C.) |
| 19% | 192 | 201 |
| 29% | 279 | 280 |

Table 2 shows that when the heating power is increased by 10%, the temperature of both the interior and exterior walls of the titanium body 110 increases by about 80-90° C.

A change in the heating power results in a change in temperature of the interior and exterior walls of the body. It is undesirable for a minor change in the heating power to cause a large change in the temperature of the interior and exterior walls of the body because changes in the temperature of the interior and exterior walls of the body greatly change the deposition rate. A change in the deposition rate makes it impossible for a thin film of uniform thickness to be deposited.

As shown in Table 1 and Table 2, when the heating power is increased by 5%, the temperature of both the interior and exterior walls of the ceramic body increases by about 100° C., and when the heating power is increased by 10%, the temperature of both the interior and exterior walls of the titanium body 110 increases by about 80-90° C. The titanium body 110 is less sensitive than the ceramic body to changes in the heating power. Therefore, a heating crucible including the titanium body 110 has a more uniform deposition rate than that of a heating crucible including a ceramic body, and deposits a thin film with a uniform thickness.

The wire 120 is made of a high resistance conductive material through which current flows and accordingly generates heat to heat the body 110. The wire 120 and the titanium body 110 must be insulated because titanium, unlike ceramic, is a conductive material. Therefore, the insulator 130 is interposed between the protrusion 150 of the body 110 and the supporter 140, or between the protrusion 150 and the wire 120 in order to insulate the body 110 from the wire 120 as illustrated in FIG. 1 and FIG. 2. The insulator 130 can be formed of any insulating material. In an exemplary embodiment, ceramic having a good thermal resistance can be used to from the insulator 130.

The titanium body 110 and the insulator 130 of this exemplary embodiment impart a uniform deposition rate and good reproducibility to the crucible of a deposition apparatus because the crucible is less sensitive to a change in the heating power.

Figure 5:
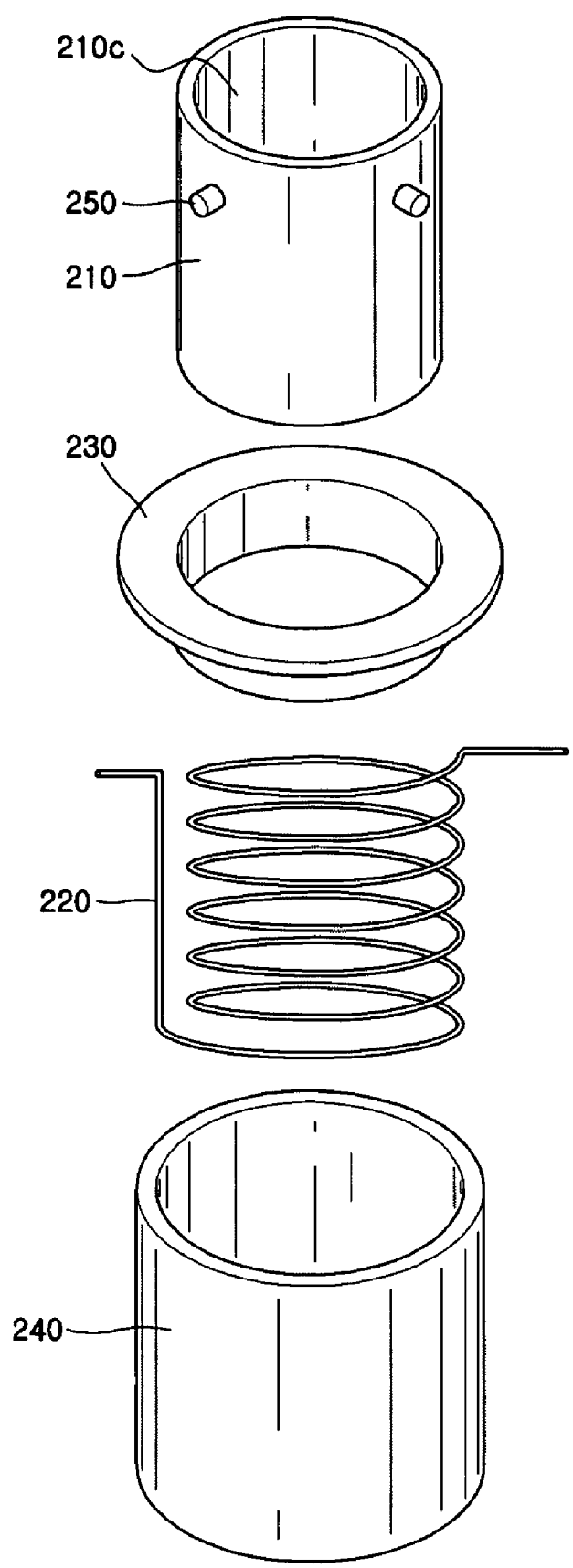
FIG. 5 shows an exploded perspective view schematically illustrating a heating crucible of a deposition apparatus according to an exemplary embodiment of the present invention.
Figure 6:
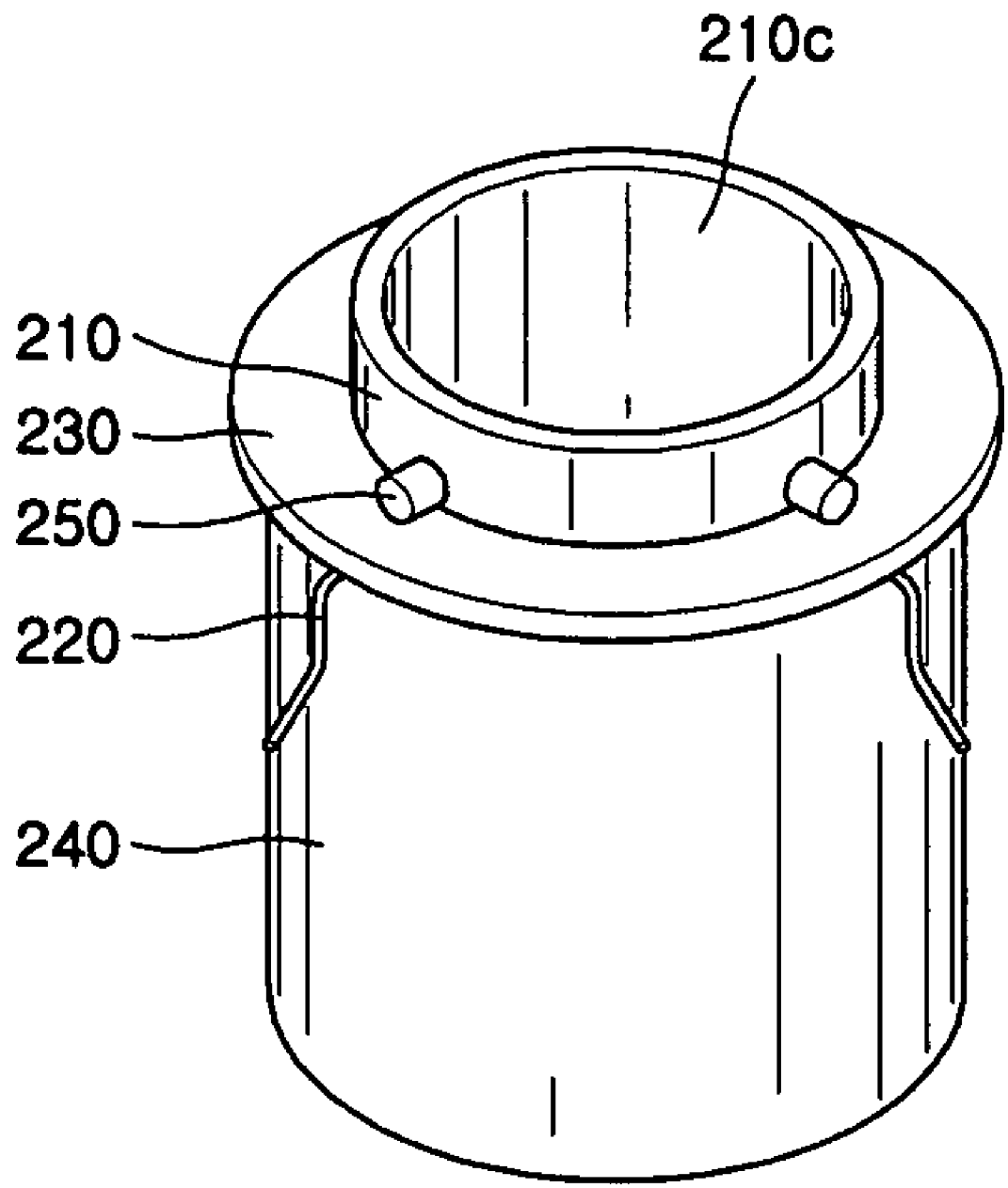
FIG. 6 shows a perspective view schematically illustrating the heating crucible of the deposition apparatus of FIG. 5.

FIG. 5 shows an exploded perspective view schematically illustrating a heating crucible of a deposition apparatus according to an exemplary embodiment of the present invention. FIG. 6 shows a perspective view schematically illustrating the heating crucible of the deposition apparatus of FIG. 5.

Referring to FIG. 5 and FIG. 6, the heating crucible comprises a body 210 made of titanium with an internal cavity to contain a material to be deposited and an opening 210c to emit the material to be deposited, a wire 220 to heat the body 210, and an insulator 230 to insulate the wire 220. The body 210 may include a temperature sensor such as thermocouple for measuring the temperature of the material in the bottom section of the body 210.

The heating crucible further comprises a cylindrically shaped supporter 240. The supporter 240 may have a variety of other shapes. The body 210 further includes a protrusion 250 to support the body 210 on the upper section of the supporter 240. The protrusion 250 may be any shape and may be plural or singular as illustrated in FIG. 5.

In this exemplary embodiment, the wire 220 is in the shape of a coil in the supporter 240. The wire 220 is partially connected to the outside of the supporter 240 as illustrated in FIG. 5, and must be insulated from the body 210. Contact between the body 210 and the wire 220 must be prevented during the deposition process.

In order to insulate the conductive titanium body 210 from the wire 220, the insulator 230 must be interposed between the protrusion 250 of the body 210 and the supporter 240, or between the protrusion 250 and the wire 220.

The titanium body 210 and the insulator 230 of this exemplary embodiment impart a uniform deposition rate and good reproducibility to the crucible of a deposition apparatus.

Figure 7:
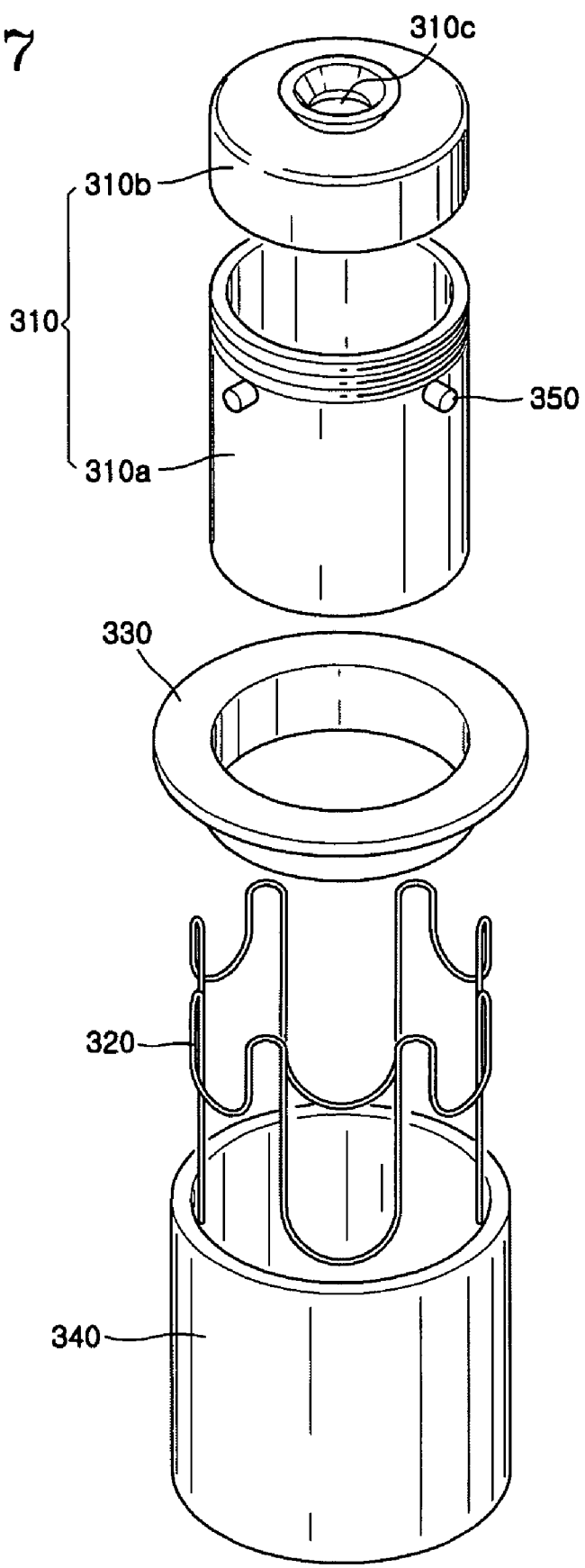
FIG. 7 shows an exploded perspective view schematically illustrating a heating crucible of a deposition apparatus according to an exemplary embodiment of the present invention.
Figure 8:
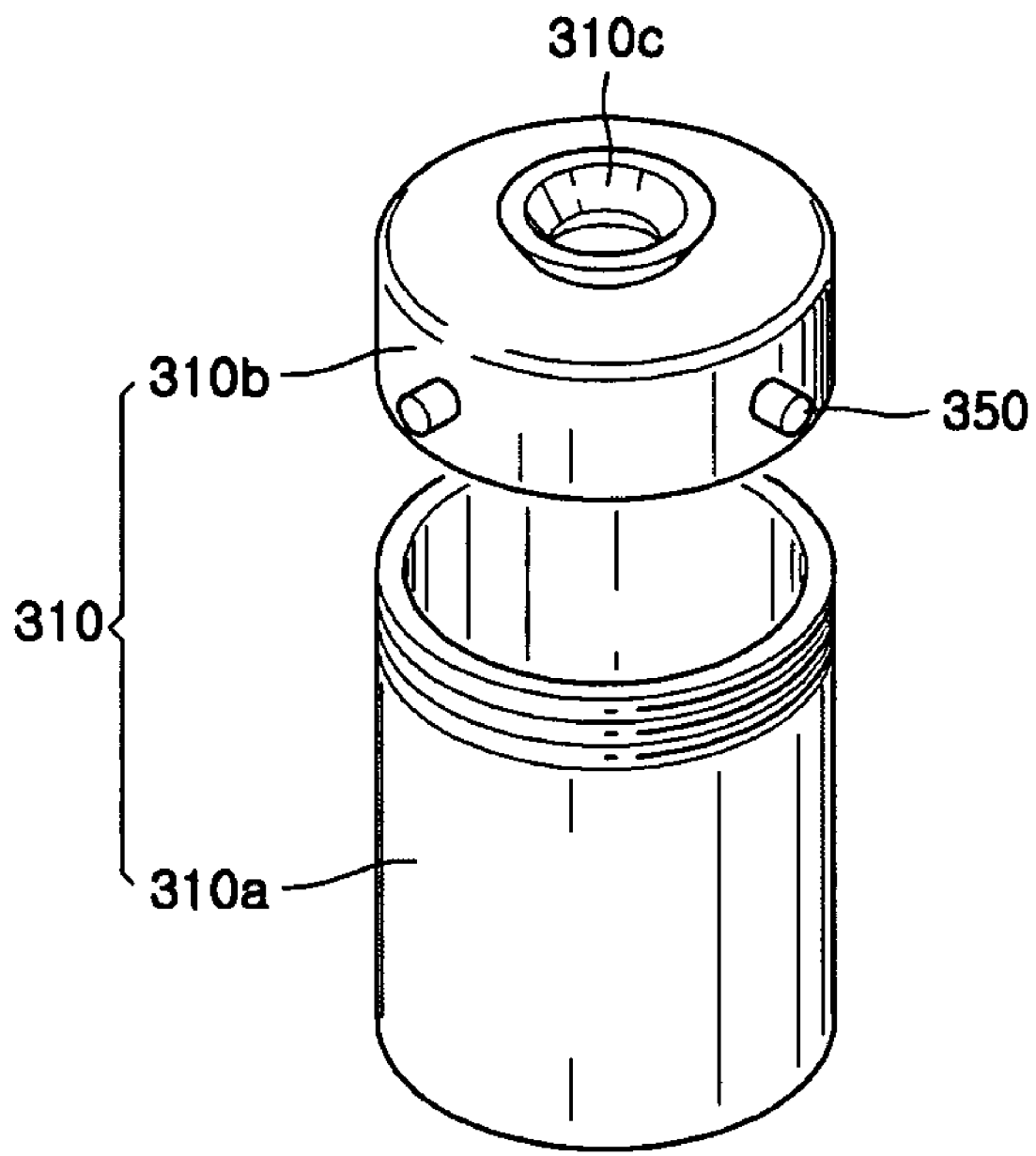
FIG. 8 shows a perspective view schematically illustrating the heating crucible of the deposition apparatus of FIG. 7.

FIG. 7 shows an exploded perspective view schematically illustrating a heating crucible of a deposition apparatus according to an exemplary embodiment of the present invention. FIG. 8 shows a perspective view schematically illustrating the heating crucible of the deposition apparatus of FIG. 7.

Referring to FIG. 7, the heating crucible includes a titanium body 310 with an internal cavity to contain a material to be deposited and an opening 310c to emit the material to be deposited, a wire 320 to heat the body 310, and an insulator 330 to insulate the body 310 from the wire 320. The body 310 may include a temperature sensor such as a thermocouple for measuring the temperature of the material in the bottom section of the body.

The heating crucible further includes a supporter 340. The body 310 further includes a protrusion 350 to support the body 310 on the upper section of the supporter 340. The wire 320 included in the heating crucible forms a plurality of "U" shapes that extend downward from the top of the supporter 340 along the inside and outside walls of the supporter 340.

The body 310 includes a cover 310b with an opening 310c and a body unit 310a with an internal cavity. The cover 310b may include an auxiliary wire (not shown) to prevent material from being deposited around the opening 310c. The cover 310b and the opening 310c increase the pressure of the material inside the body 310.

The protrusion 350 for supporting the body 310 using the supporter 340 may be included in the body unit 310a of the body 310, or may be included in the cover 310b as illustrated in FIG. 8.

The body 310 is made of titanium instead of ceramic because a change in the heating power results in a smaller change to the interior temperature of a titanium body than would occur in a conventional ceramic body.

The titanium body 310, the insulator 330, and the body unit 310a and the cover 310b make it possible to fabricate a heating crucible of a deposition apparatus having a uniform deposition rate, good reproducibility, and increased emission pressure of the material to be deposited.

Figure 9:
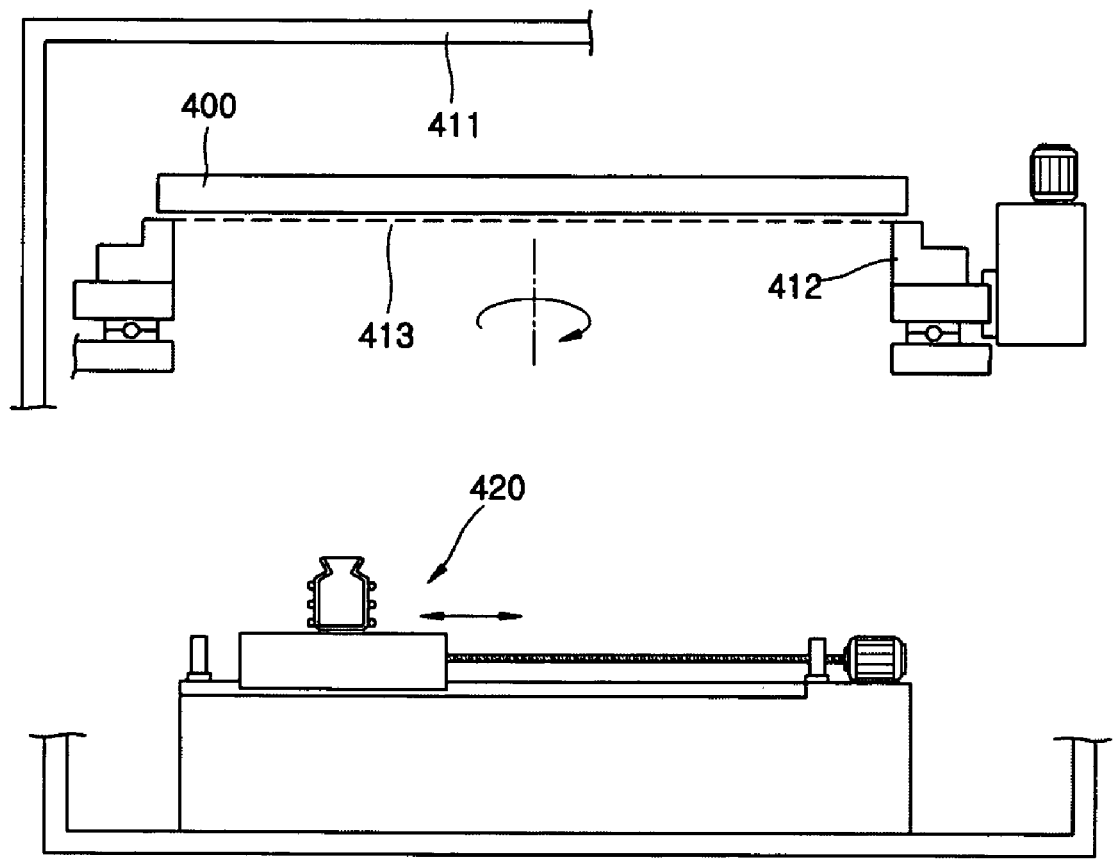
FIG. 9 shows a perspective view schematically illustrating a deposition apparatus according an exemplary embodiment of the present invention.

FIG. 9 shows a perspective view schematically illustrating a deposition apparatus according to an exemplary embodiment of the present invention.

Referring to FIG. 9, the deposition apparatus of the present invention includes a chamber 411 with a substrate supporter 412 to support a substrate 400, a deposition mask 413 on the substrate 400 to form a pattern of slits in the material deposited on the substrate 400, and a heating crucible 420 facing the substrate 400 with the deposition mask 413 interposed therebetween.

The substrate supporter 412 supports the corners of the substrate 400, but is not limited thereto. The substrate supporter 412 may further include means for preventing the substrate 400 from being deflected due to the weight of the substrate 400, and means for tightening the deposition mask 413 against the substrate 400.

The heating crucible may be singular or plural. A plurality of heating crucibles 420 may be arranged in line and rotated. The arrangement of the heating crucibles 420 is not restricted to the exemplary embodiment illustrated in FIG. 9.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. Heating crucible, comprising:
a body made of titanium;
a wire capable of heating the body; and
an insulator capable of electrically insulating the body from the wire, the insulator being interposed between the body and the wire, and being in direct contact with the body and the wire; and
a supporter capable of supporting the body,
wherein the wire is extended from a top to both an inside wall and an outside wall of the supporter,
wherein the body further comprises an internal cavity capable of containing a material to be deposited and an opening capable of emitting the material to be deposited,
wherein the body further comprises a protrusion capable of supporting the body,
wherein the protrusion supports the body on an upper section of the supporter capable of supporting the body, and
wherein the protrusion directly contacts an upper surface of the insulator.

2. The heating crucible of claim 1,
wherein the insulator is made of ceramic.

3. The heating crucible of claim 1,
wherein the supporter is cylindrically shaped, and
wherein the wire is in the supporter, and
wherein the wire forms a plurality of "U" shapes that extend downward from the top of the supporter along the inside and outside walls of the supporter.

4. The heating crucible of claim 1,
wherein the supporter is cylindrically shaped, and
wherein the wire is in the supporter, and
wherein the wire extends from the top of the supporter along the inside walls of the supporter.

5. The heating crucible of claim 1,
wherein the supporter is cylindrically shaped, and
wherein the wire is in the supporter, and
wherein the wire is in the shape of a coil.

6. The heating crucible of claim 1,
wherein the insulator is interposed between the protrusion and the supporter, or between the protrusion and the wire.

7. The heating crucible of claim 1,
wherein the body further comprises a cover having an opening.

8. A deposition apparatus, comprising:
a substrate supporter to support a substrate, and
a heating crucible facing the substrate, the heating crucible being capable of emitting a material to be deposited on the substrate,
wherein the heating crucible comprises:
a body made of titanium,
a wire capable of heating the body,
an insulator capable of electrically insulating the body from the wire, the insulator being interposed between the body and the wire, and being in direct contact with the body and the wire;
a supporter capable of supporting the body,
wherein the wire is extended from a top to both an inside wall and an outside wall of the supporter,
wherein the body further comprises an internal cavity capable of containing a material to be deposited and an opening capable of emitting the material to be deposited,
wherein the body further comprises a protrusion capable of supporting the body,
wherein the protrusion supports the body on an upper section of the supporter capable of supporting the body, and
wherein the protrusion directly contacts an upper surface of the insulator.

9. The deposition apparatus of claim 8,
wherein the insulator is made of ceramic.

10. The deposition apparatus of claim 8,
wherein the supporter is cylindrically shaped, and
wherein the wire is in the supporter, and
wherein the wire forms a plurality of "U" shapes that extend downward from the top of the supporter along the inside and outside walls of the supporter.

11. The deposition apparatus of claim 8,
wherein the supporter is cylindrically shaped, and
wherein the wire is in the supporter, and
wherein the wire extends from the top of the supporter along the inside walls of the supporter.

12. The deposition apparatus of claim 8,
wherein the supporter is cylindrically shaped, and
wherein the wire is in the supporter, and
wherein the wire is in the shape of a coil.

13. The deposition apparatus of claim 8, wherein the insulator is interposed between the protrusion and the supporter, or between the protrusion and the wire.

14. The deposition apparatus of claim 8,
wherein the body further comprises a cover having an opening.

* * * * *

UNITED STATES PATENT AND TRADEMARK OFFICE
CERTIFICATE OF CORRECTION

| | |
|---|---|
| PATENT NO. | : 7,922,820 B2 |
| APPLICATION NO. | : 11/266397 |
| DATED | : April 12, 2011 |
| INVENTOR(S) | : Seoung-Yoon Ryu, Kyong-Tae Yu and Sung-Rag Ma |

It is certified that error appears in the above-identified patent and that said Letters Patent is hereby corrected as shown below:

On the Title page of the patent, Item (75), "Kyong-Tac Yu" should be changed to -- Kyong-Tae Yu --.

Signed and Sealed this
Nineteenth Day of July, 2011

David J. Kappos
*Director of the United States Patent and Trademark Office*